United States Patent
Kusunoki

(10) Patent No.: US 8,565,342 B2
(45) Date of Patent: Oct. 22, 2013

(54) POWER AMPLIFICATION APPARATUS, OFDM MODULATION APPARATUS, WIRELESS TRANSMISSION APPARATUS, AND DISTORTION REDUCTION METHOD FOR POWER AMPLIFICATION APPARATUS

(75) Inventor: Shigeo Kusunoki, Kanagawa (JP)

(73) Assignees: Sony Corporation, Tokyo (JP); Sony Mobile Communications AB, Tokyo (JP)

( * ) Notice: Subject to any disclaimer, the term of this patent is extended or adjusted under 35 U.S.C. 154(b) by 276 days.

(21) Appl. No.: 13/080,058

(22) Filed: Apr. 5, 2011

(65) Prior Publication Data

US 2011/0310990 A1    Dec. 22, 2011

Related U.S. Application Data

(60) Provisional application No. 61/357,400, filed on Jun. 22, 2010.

(51) Int. Cl.
*H04K 1/02* (2006.01)
(52) U.S. Cl.
USPC ........... 375/297; 375/296; 375/260; 375/295; 455/114.3; 455/127.3; 330/251
(58) Field of Classification Search
USPC ............... 375/297, 296, 260, 295; 455/114.3, 455/127.3; 330/251
See application file for complete search history.

(56) References Cited

U.S. PATENT DOCUMENTS

| | | | | |
|---|---|---|---|---|
| 3,936,819 A * | 2/1976 | Angelle et al. | ................. | 341/139 |
| 6,549,566 B1 * | 4/2003 | Lee et al. | ........................ | 375/219 |
| 7,139,534 B2 * | 11/2006 | Tanabe et al. | .................. | 455/108 |
| 7,567,625 B2 * | 7/2009 | Oh et al. | ........................ | 375/299 |
| 7,809,078 B2 * | 10/2010 | Hori et al. | ...................... | 375/295 |
| 7,889,632 B2 * | 2/2011 | Hamamoto et al. | .......... | 370/203 |
| 7,986,741 B2 * | 7/2011 | Tsai et al. | ..................... | 375/261 |
| 8,179,989 B2 * | 5/2012 | Toyomane et al. | ........... | 375/260 |
| 8,194,612 B2 * | 6/2012 | Kawasaki et al. | ............. | 370/331 |
| 2002/0176509 A1 * | 11/2002 | Gatherer et al. | .............. | 375/260 |
| 2006/0209673 A1 * | 9/2006 | Ichihara et al. | ............... | 370/208 |

FOREIGN PATENT DOCUMENTS

| | | |
|---|---|---|
| JP | 2005-086440 | 3/2005 |
| JP | 2007-208729 | 8/2007 |
| JP | 2009-239539 | 10/2009 |
| JP | 2009-239723 | 10/2009 |

* cited by examiner

*Primary Examiner* — Daniel Washburn
*Assistant Examiner* — Rahel Guarino
(74) *Attorney, Agent, or Firm* — Oblon, Spivak, McClelland, Maier & Neustadt, L.L.P.

(57) ABSTRACT

A power amplification apparatus that performs an inverse fast Fourier transformation on data allocated to a plurality of sub-carriers, converts time-domain data output in parallel from the inverse fast Fourier transformation into a time-domain analog signal, performs a power amplification on the time-domain analog signal, wherein a saturation output level of the power amplification is adjustable in accordance with a switching signal. The power amplification apparatus also compares an amplitude of a signal in each time slot of the time-domain analog signal with a predetermined threshold and switches the saturation output level of the power amplification based on an output of the comparing.

16 Claims, 11 Drawing Sheets

POWER AMPLIFICATION APPARATUS, OFDM MODULATION APPARATUS, WIRELESS TRANSMISSION APPARATUS, AND DISTORTION REDUCTION METHOD FOR POWER AMPLIFICATION APPARATUS

CROSS REFERENCE TO RELATED APPLICATION

The present application claims the benefit of the earlier filing date of U.S. Provisional Patent Application Ser. No. 61/357,400 filed on Jun. 22, 2010, the entire contents of which is incorporated herein by reference.

BACKGROUND

1. Field of the Disclosure

The present disclosure relates to a power amplifier for use in a digital portable communication terminal, and in particular to a power amplification apparatus, an OFDM modulation apparatus, a wireless transmission apparatus, and a distortion reduction method for a power amplification apparatus that allow reduction of distortion produced by a power amplifier.

2. Description of the Related Art

In the field of high-speed mobile communication, a new scheme called LTE (Long Term Evolution) is currently being developed and put into practical use. For modulation in transmission (uplink from a terminal), the LTE uses diffusive orthogonal frequency-domain multi-signal modulation (SC-FDMA: Single Carrier Frequency Division Multiple Access), which is a variation of OFDM (Orthogonal Frequency Division Multiplexing). Transmission apparatuses that utilize the SC-FDMA are disclosed in Japanese Unexamined Patent Application Publication No. 2009-239539 and Japanese Unexamined Patent Application Publication No. 2009-239723.

In the SC-FDMA, the peak average power ratio (PAPR) of a signal input to a power amplifier is about 5.5 dB, which is higher by 2 dB or more than that in W-CDMA (Wide-band Code Division Multiple Access), which is a scheme according to the related art. Thus, more severe restrictions are imposed on the power amplifier. In order to avoid this issue, it is conceivable to decrease desired power. However, this approach naturally decreases the communication speed, which contradicts to an original purpose.

As an example of techniques associated with the improvement of the PAPR according to the related art, Japanese Unexamined Patent Application Publication No.2007-208729 proposes an OFDM communication device that allows reduction of peak power of an OFDM time waveform without wasting an FDD allocated band. In this technique, a peak portion of a signal input to a power amplifier is detected. Based on a detected distortion factor, a shaped waveform for reducing the distortion factor is generated. Modulation results obtained by modulating the shaped waveform are synthesized with a modulation signal obtained by modulating transmission data in a band other than a band allocated to the transmission data to generate a modulation signal from which the distortion factor has been reduced.

As another example of techniques according to the related art, Japanese Unexamined Patent Application Publication No. 2005-86440 discloses "METHOD AND DEVICE FOR TRANSMITTING OFDM SIGNAL", in which distortion at an output of a power amplifier is detected and superimposed on an OFDM signal to generate a pre-distortion signal and linearize the output of the power amplifier.

SUMMARY OF THE DISCLOSURE

In the above techniques according to the related art, a peak of a signal is detected and suppressed by adjusting an input signal using a feedback circuit at a stage prior to the input of the power amplifier. Thus, a time delay may occur in compensation for distortion produced by the power amplifier, which makes adequate compensation difficult. Also, a feedback circuit with a complicated and high-accuracy configuration is used to detect distortion produced by the power amplifier itself. This hinders size reduction of a mobile terminal, that is, a cellular phone terminal, or makes high-accuracy adjustment too difficult to secure the characteristics of the power amplifier. Thus, it is significantly difficult to implement the techniques according to the related art.

It is therefore desirable to provide a power amplifier and a distortion reduction method for a power amplifier that allow to perform distortion compensation without decreasing desired power even in the case where the peak average power ratio (PAPR) of a signal input to the power amplifier.

According to an embodiment of the present disclosure, there is provided a power amplification apparatus that performs an inverse fast Fourier transformation on data allocated to a plurality of sub-carriers, converts time-domain data output in parallel from the inverse fast Fourier transformation into a time-domain analog signal, performs a power amplification on the time-domain analog signal, wherein a saturation output level of the power amplification is adjustable in accordance with a switching signal. The power amplification apparatus also compares an amplitude of a signal in each time slot of the time-domain analog signal with a predetermined threshold and switches the saturation output level of the power amplification based on an output of the comparing.

DESCRIPTION OF THE PREFERRED EMBODIMENTS

A preferred embodiment of the present disclosure will be described in detail below with reference to the drawings.

In the LTE, a frequency band forming a part of a system band is allocated to each portable terminal (UE: User Equipment) through frequency scheduling for SC-FDMA wireless access for uplink as for downlink. DFT (Discrete Fourier Transform)-Spread OFDM is used to generate an SC-FDMA signal in the frequency domain.

Figure 1:
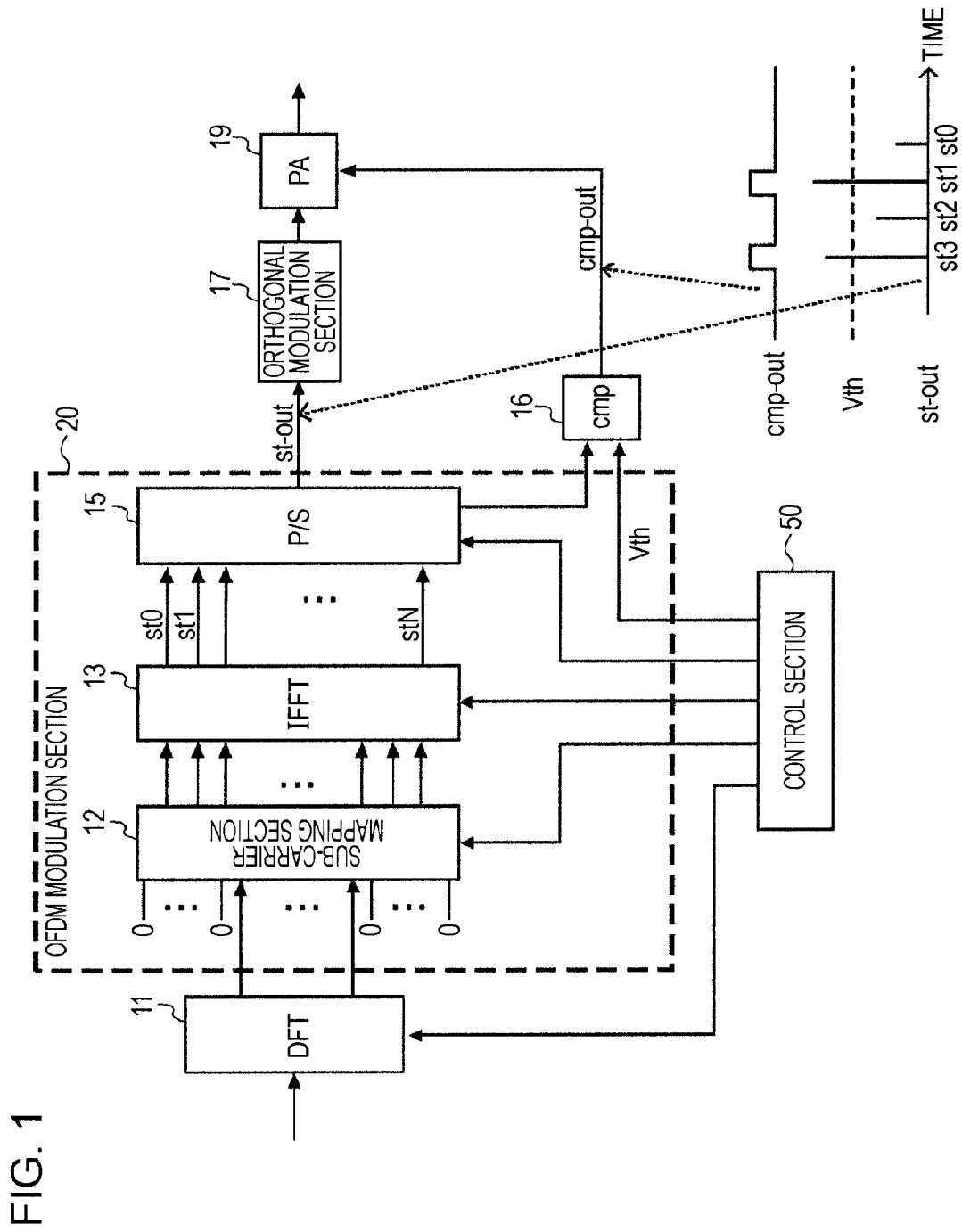
FIG. 1 shows a main configuration of a transmission block (wireless transmission apparatus) for DFT-Spread OFDM provided in a portable terminal according to an embodiment of the present disclosure.

FIG. 1 shows a main configuration of a transmission apparatus (wireless transmission apparatus) for DFT-Spread OFDM provided in a portable terminal according to the embodiment. The block diagram is supplemented with a timing diagram showing how operation is performed in accompaniment to a predetermined output.

The wireless transmission apparatus includes a DFT section 11, an OFDM modulation section 20, an orthogonal modulation section 17, a power amplifier 19, a comparator 16, and a control section 50. The OFDM modulation section 20 includes a sub-carrier mapping section 12, an IFFT section 13, and a parallel/serial conversion section 15. The OFDM modulation section 20 may be implemented as an integrated circuit. The integrated circuit may include the comparator 16 and/or the DFT section 11.

Operation of the wireless transmission apparatus of FIG. 1 will be described.

In the DFT-Spread OFDM, the DFT section 11 of the portable terminal first performs a DFT process on a sequence of information symbols after modulation. The "modulation" here refers to so-called primary modulation such as QPSK or QAM. The DFT section 11 performs a discrete Fourier transform on a time-domain signal in units of a predetermined number of primary modulation symbols to output a frequency-domain signal.

Then, the sub-carrier mapping section 12 maps the information symbols after the DFT process to (a plurality of sub-carriers in) the frequency band allocated to the terminal, and maps zero to (a plurality of sub-carriers in) other frequency bands. The IFFT section 13 performs an IFFT (Inverse Fast Fourier Transform) process on the thus mapped sequence of information symbols to generate transmission signals st0 to stN for each time slot. That is, the IFFT section 13 performs an inverse fast Fourier transform on information symbol data strings allocated to a plurality of sub-carriers as frequency-domain signals.

The parallel/serial conversion section 15 outputs the transmission signals st0 to stN in series along the time axis as an I-signal and a Q-signal. That is, the parallel/serial conversion section 15 has a function of sequentially converting the transmission signals st0 to stN, which are output in parallel from the IFFT section 13 as time-domain data, into a serial signal st-out to output the serial signal st-out. The serial signal st-out output from the parallel/serial conversion section 15 is an analog signal representing a signal voltage in the time direction. The orthogonal modulation section 17 performs a high-frequency conversion on (up-converts) the serial signal st-out. An output of the orthogonal modulation section 17 is input to the power amplifier 19. The transmission signals are amplified to necessary power, and are supplied to an antenna (not shown).

Also, the parallel/serial conversion section 15 sequentially sends to the comparator 16 each of signals in respective time slots of the time-domain data output in parallel (the transmission signals st0 to stN). The comparator 16 compares the amplitude of the transmission signals st0 to stN with a predetermined threshold Vth. When the amplitude of the transmission signal exceeds the threshold Vth, an output cmp-out of the comparator 16 changes (in the example, from a lower level to a higher level). The output cmp-out of the comparator 16 is input to a control input terminal of the power amplifier 19. When the transmission signals are amplified by the power amplifier 19, the saturation output level of the power amplifier 19 is temporarily changed (raised) from a first level to a second level that is higher than the first level. Therefore, the power amplifier 19 used in the embodiment has a saturation output level that is adjustable in accordance with a switching signal from the outside.

By using the thus configured DFT-Spread OFDM for uplink, it is possible to achieve the clock frequency and the sub-carrier spacing that are the same as those in OFDMA for downlink.

What is important about the present disclosure is that the output of the inverse fast Fourier transform section (IFFT) accumulates a signal waveform corresponding to one frame of the transmission signal and thus makes is possible to know in advance where on the time axis in a frame a high output appears. Hence, in the case where the transmission signal exceeds the threshold Vth, the comparator 16 produces an output cmp-out as a characteristic switching signal at the timing when the transmission signal is input to the power amplifier 19. The switching signal is used to switch the power amplifier 19 to a mode with high saturation power, which suppresses power distortion.

Figure 2:
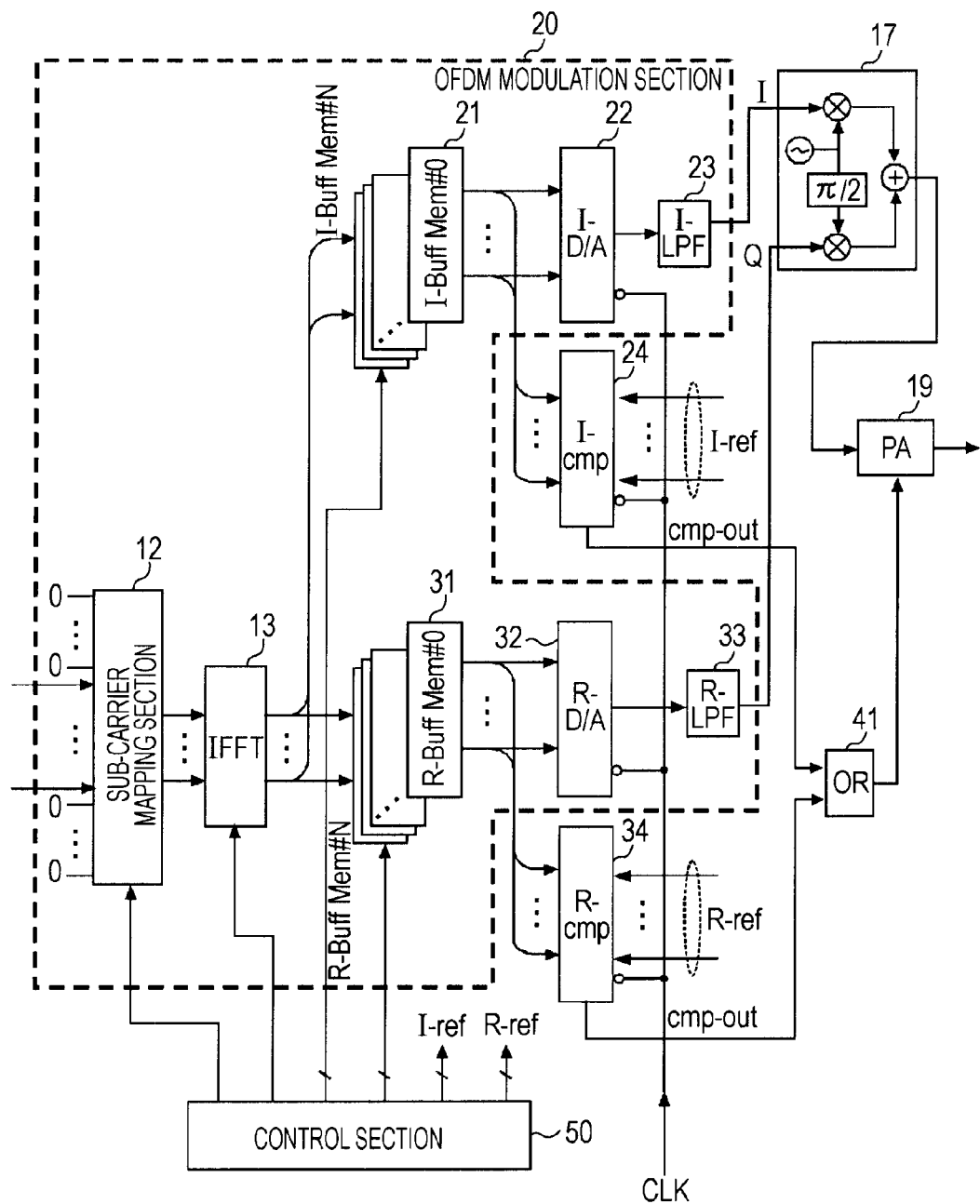
FIG. 2 shows a specific circuit configuration of the wireless transmission apparatus shown in FIG. 1.

FIG. 2 shows a specific circuit configuration of the wireless transmission apparatus shown in FIG. 1. Elements corresponding to the elements shown in FIG. 1 are denoted by the same reference numerals to omit repeated description.

The IFFT section 13 in the OFDM modulation section 20 shown in FIG. 1 respectively generates transmission signals st0 to stN for a real-part output and an imaginary-part output. In the example of FIG. 2, the parallel/serial conversion section 15 includes an imaginary-part buffer memory (I-BuffMem) 21 and a real-part buffer memory (R-BuffMem) 31, an imaginary-part digital/analog converter (I-D/A) 22 and a real-part digital/analog converter (R-D/A) 32, and an imaginary-part low-pass filter (I-LPF) 23 and a real-part low-pass filter (R-LPF) 33. The imaginary-part buffer memory (I-BuffMem) 21 and the real-part buffer memory (R-BuffMem) 31 respectively include a plurality of memory regions in which time-domain data of the real-part output and the imaginary-part output are stored. The imaginary-part digital/analog converter (I-D/A) 22 and the real-part digital/analog converter (R-D/A) 32 sequentially convert the time-domain data stored in the imaginary-part buffer memory 21 and the real-part buffer memory 31 into analog signals. The imaginary-part low-pass filter (I-LPF) 23 and the real-part low-pass filter (R-LPF) 33 respectively low-pass filter outputs of the imaginary-part digital/analog converter (I-D/A) 22 and the real-part digital/analog converter (R-D/A) 32.

Thus, the parallel/serial conversion section 15 respectively stores the transmission signals st0 to stN, which are output in parallel from the IFFT section 13, in the plurality of buffer memories 21 and 31 and outputs the transmission signals to the D/A converters 22 and 32 in series in a time-sharing manner, under control by the control section 50 and separately for the imaginary part and the real part. The outputs of the D/A converters 22 and 32 are respectively input to the low-pass filters 23 and 33.

In the configuration of FIG. 2, the orthogonal modulation section 17 shown in FIG. 1 is formed by an orthogonal modulation section (QM) 17 that performs an orthogonal modulation on the I-signal and the Q-signal. The outputs of both the low-pass filters are input to the orthogonal modulation section (QM) 17. Here, the real part and the imaginary part are respectively input to a Q-input and an I-input of the orthogonal modulation section 17. The orthogonal modulation section 17 is a circuit that performs an orthogonal modulation (and an up conversion) on an analog signal using a cosine wave and a sine wave of a carrier wave frequency, and is normally formed by a carrier frequency generator, two multipliers, a phase shifter, and an adder. An output of the orthogonal modulation section 17 is output as a high-frequency signal, and is input to the power amplifier 19, which has a function of switching between the saturation output levels in accordance with a switching signal from the outside.

The memory output buses of the imaginary-part and real-part buffer memories I-BuffMem and R-BuffMem are respectively branched and input to digital comparators (I-cmp and R-cmp) 24 and 34 respectively prepared for the imaginary part and the real part. The digital comparators 24 and 34 are equivalent to the comparator 16 of FIG. 1. Digital values that are equivalent to constant reference voltages I-ref and R-ref are set in advance to the other input of the digital comparators 24 and 34. The digital values are equivalent to the above predetermined threshold Vth.

In the case where the buffer memory output increases to a value that is larger than the corresponding reference voltage, the digital comparators 24 and 34 generate an output cmp-out as a switching signal. The outputs cmp-put from both the digital comparators 24 and 34 are input to a logical sum circuit (OR) 41, and the logical sum of both the outputs is input to the control input terminal of the power amplifier 19.

Next, operation of the configuration of FIG. 2 will be described. In FIG. 2, the inverse fast Fourier transform section (IFFT) 13 outputs separate digital values for the imaginary part and the real part. Both the output digital values are respectively stored in the imaginary-part and real-part buffer memories 21 and 31, the outputs of which are sequentially subjected to a D/A conversion. That is, data sequentially read out from a plurality of memories in the buffer memories are respectively subjected to an analog conversion performed by the imaginary-part and real-part digital/analog converters 22 and 32. The outputs of the digital/analog converters 22 and 32 pass through the low-pass filters R-LPF and I-LPF, which remove unnecessary components produced in the analog conversion, and are input to the orthogonal modulation section 17. Here, as known, an orthogonal modulation is performed on the I-signal and the Q-signal in accordance with the formula below to obtain an output s(t) superimposed on a high-frequency signal. The output s(t) is input to the power amplifier 19, amplified to necessary power, and thereafter supplied to an antenna.

$$s(t) = I \times \sin(2\pi ft) + Q \times \cos(2\pi ft) = A \times \sin(2\pi ft + \theta)$$

where $A = \sqrt{(I^2 + Q^2)}$ and $\theta = \tan^{-1}(I/Q)$.

Of the memory outputs of the buffer memories 21 and 31, memory outputs to be output to the D/A converters 22 and 32 are respectively branched and input to the digital comparators 24 and 34. Digital values that are equivalent to the above constant reference voltages I-ref and R-ref are set in advance to the other input of the digital comparators 24 and 34. The digital comparators 24 and 34 generate the above output cmp-out in the case where the input memory output increases to a value that is larger than the reference voltage. The outputs cmp-put are input to the logical sum circuit 41, and the logical sum of both the outputs is input to the switching terminal of the power amplifier 19.

Figure 3:
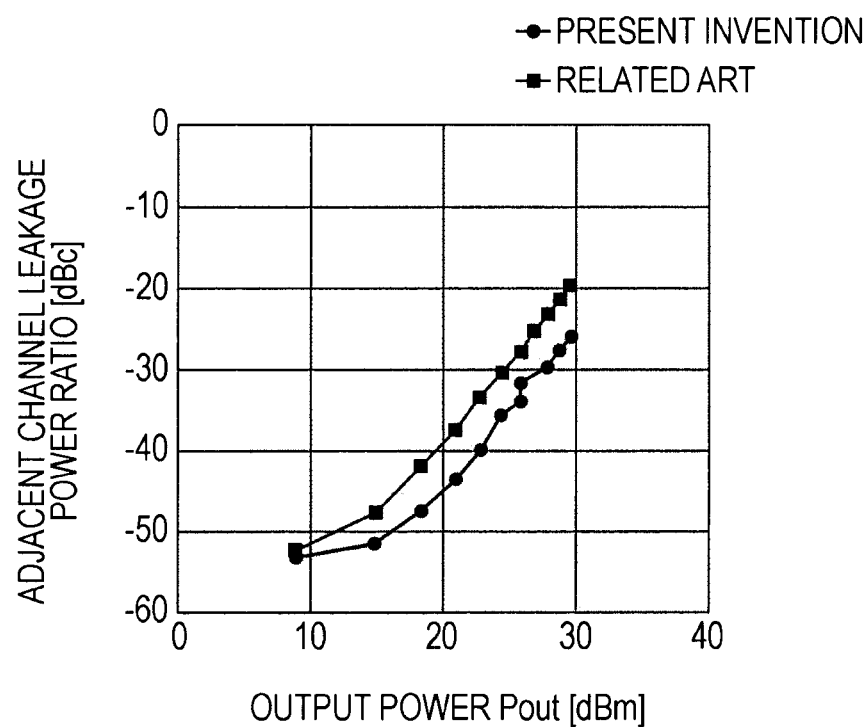
FIG. 3 is a graph showing simulation results for the effect of the embodiment of the present disclosure.

FIG. 3 is a graph showing simulation results for the effect of the embodiment. In the graph, the horizontal axis represents the output power Pout [dBm] of the power amplifier 19, and the vertical axis represents the adjacent channel leakage power ratio [dBc]. A graph plotted by circular dots indicates the results obtained in accordance with the present disclosure, and a graph plotted by square dots indicates the results obtained in accordance with the related art. From the graphs, it is recognized that the difference in adjacent channel leakage power ratio for the same small-signal gain between high and low saturation output levels of the power amplifier 19 depends on the output power.

Figure 4:
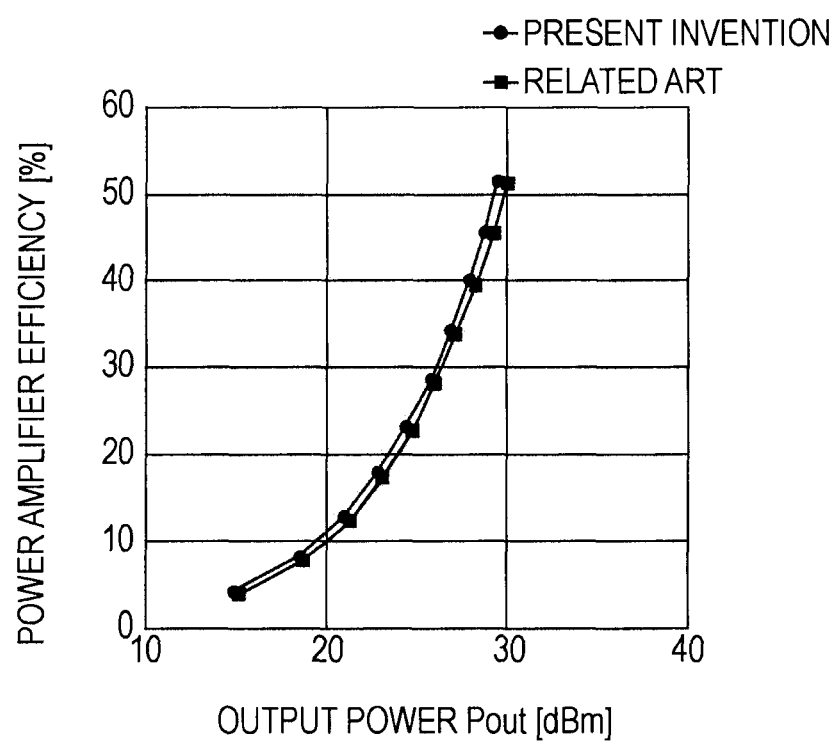
FIG. 4 is a graph showing the efficiency characteristics of a power amplifier according to the embodiment of the present disclosure.

FIG. 4 is a graph showing the efficiency characteristics of the power amplifier 19. In the graph, the horizontal axis represents the output power Pout [dBm] of the power amplifier 19, and the vertical axis represents the power amplifier efficiency [%]. As in FIG. 3, a graph plotted by circular dots indicates the results obtained in accordance with the present disclosure, and a graph plotted by square dots indicates the results obtained in accordance with the related art.

Figure 5:
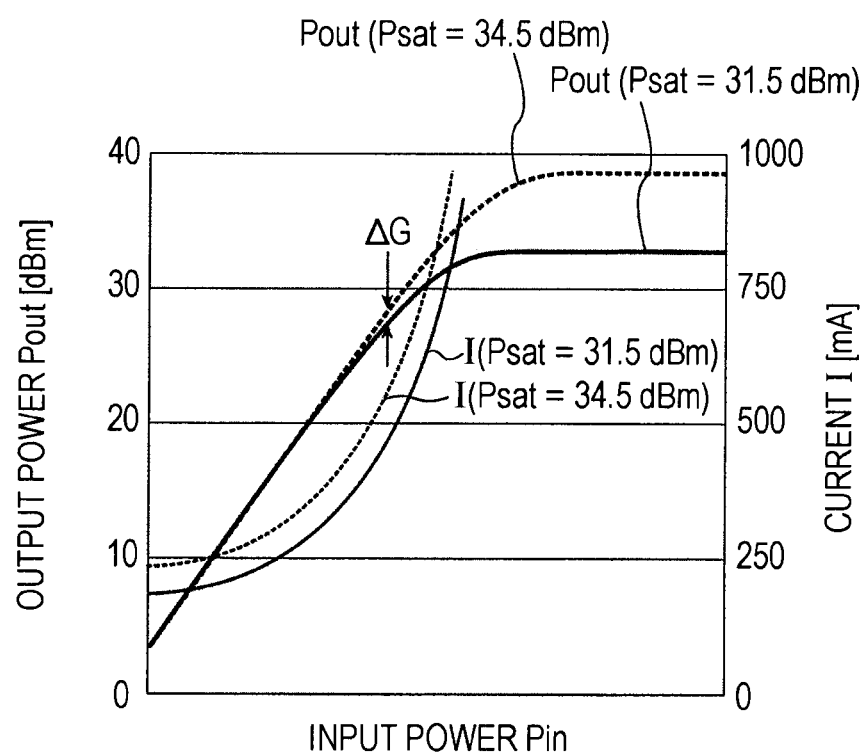
FIG. 5 is a graph showing the characteristics of the power amplifier used in the simulation of FIG. 3.

FIG. 5 is a graph showing the characteristics of the power amplifier used in the simulation. In the graph, the horizontal axis represents the input power Pin, the left vertical axis represents the output power Pout [dBm], and the right vertical axis represents the current I [mA] flowing through the power amplifier. In the embodiment, the power amplifier has two saturation outputs, 31.5 dBm and 34.5 dBm, that are switchable between each other. In the example, the reference voltage for switching between the two saturations output levels of the power amplifier is kept at a constant value. It is found that the current flowing through the power amplifier is higher with a saturation output Psat=34.5 dBm by about 50 mA on average.

As seen from FIG. 3, the adjacent channel leakage power ratio according to the embodiment is improved compared to the related art by about 5 dB over the entire output range. Also, as seen from FIG. 4, the efficiency is varied along with switching between the two saturation output levels by at most about 2 points (percent), which is converted into a current of about 5 mA at around Pout=27.5 dBm, which exhibits a very little increase in overall current consumption. In FIG. 3, in addition, an adjacent channel leakage power ratio of −35 dBc is retained with output power Pout of 26 dBm according to the embodiment of the present disclosure, as opposed to 21.5 dBm according to the related art. That is, the embodiment of the present disclosure has an advantage that the transmission power of a cellular phone terminal may be increased by 5.5 dB. This is equivalent to about 3.5 times the transmission rate when converted in terms of symbol rate, which brings a significant effect that makes it possible to achieve the object of the LTE system.

Figure 6:
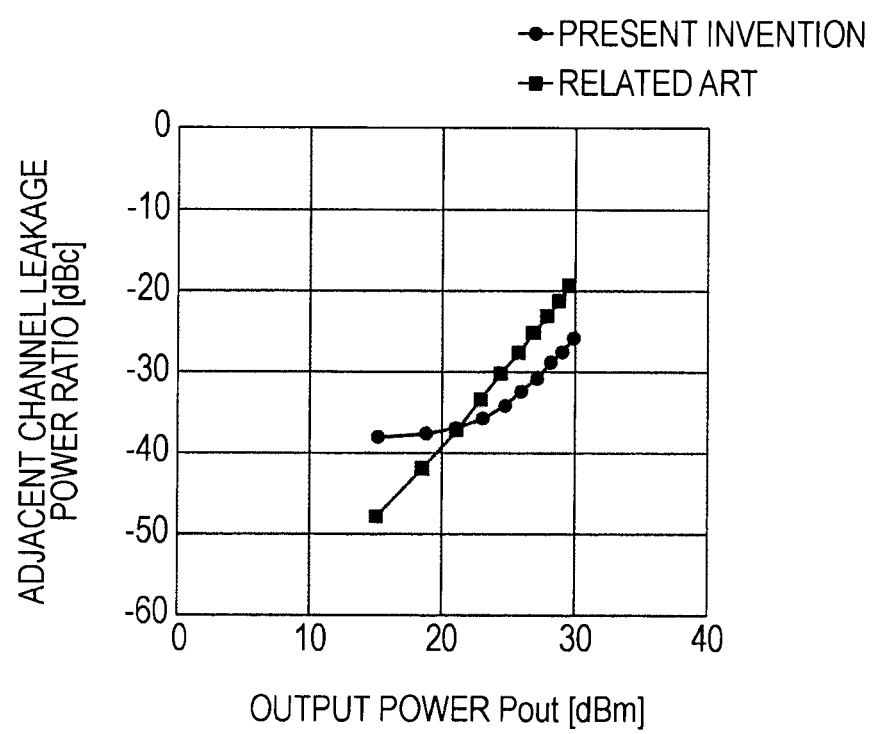
FIG. 6 is a graph showing the effect obtained in the case where there is a difference in small-signal gain of the power amplifier between two saturation output levels according to the embodiment of the present disclosure.

FIG. 6 is a graph showing the effect obtained in the case where there is a difference in small-signal gain of the power amplifier between two saturation output levels. The vertical axis and the horizontal axis of the graph are the same as those of FIG. 3. A difference in small-signal gain causes signal distortion. Such signal distortion degrades the adjacent channel leakage power ratio. From FIG. 6, it is found that the adjacent channel leakage power ratio for the embodiment of the present disclosure is degraded at Pout=20.5 dBm or lower. However, it is also confirmed that an effect equivalent to the case of FIG. 3 is obtained at higher output.

Figure 7:
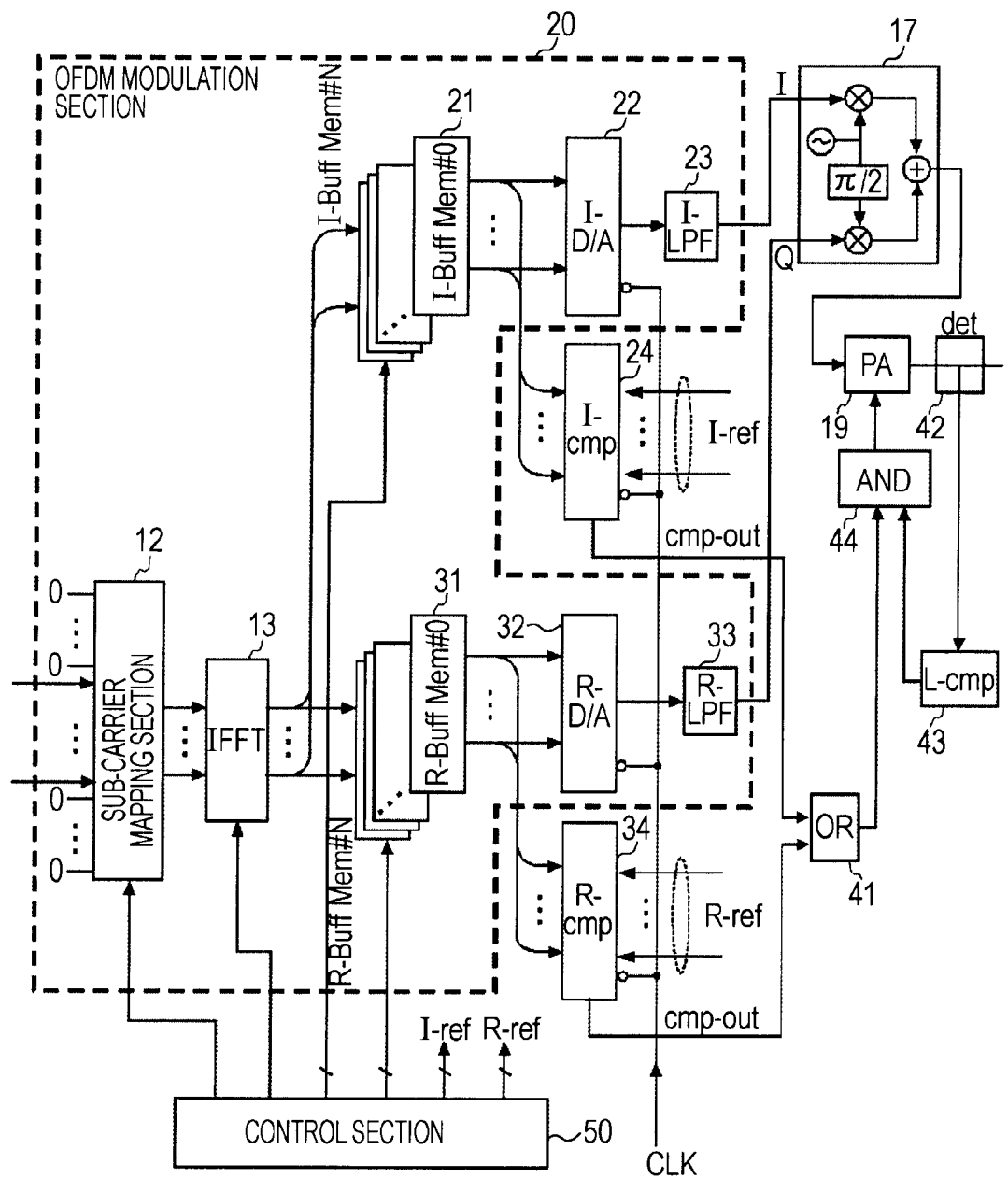
FIG. 7 is a block diagram showing a configuration of a wireless transmission apparatus according to a second embodiment of the present disclosure.

FIG. 7 is a block diagram showing a configuration of a wireless transmission apparatus according to a second embodiment of the present disclosure. In the drawing, elements similar to the elements shown in the first embodiment (FIG. 2) are denoted by the same reference numerals to omit repeated description.

In the second embodiment, the following elements are added to the first embodiment. A detection section (det) 42 is connected to the output of the power amplifier 19 to take out a part of the power as detected power. A wave detection circuit (L_cmp) 43 is provided to generate a logical one output signal when the value of the detected power exceeds a predetermined value. A logical product circuit (AND) 44 is provided to calculate a logical product of the output of the comparator 43 and the output of the logical sum circuit (OR) 41 according to the first embodiment. The output of the logical product circuit 44 is input to the switching terminal of the power amplifier 19. The logical product circuit (AND) 44 functions as a gate section that blocks the switching signal for the power amplifier 19 in the case where the detected power is the predetermined value or less on the basis of the output of the comparator 43.

According to the configuration described above, a distortion compensation function does not operate when (the average value of) the detected power is a certain level or lower. As a result, the efficiency is not degraded at low output.

Figure 8:
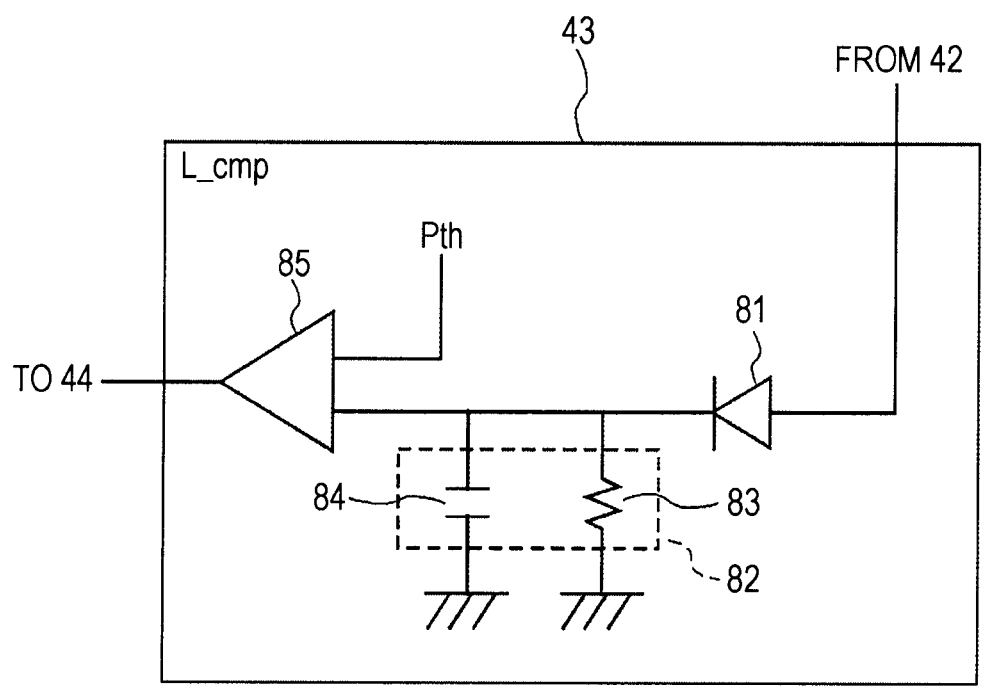
FIG. 8 shows a specific exemplary circuit configuration of a wave detection circuit (L_cmp) shown in FIG. 7.

FIG. 8 shows a specific exemplary circuit configuration of the wave detection circuit (L_cmp) 43. The comparator 43 includes a diode 81 that receives an output of the detection section 42, a shunt circuit 82 connected between an output of the diode 81 and the ground, and a comparator 85 that compares an output of the shunt circuit 82 with a predetermined power value Pth. The shunt circuit 82 is formed by a circuit which has a predetermined time constant and in which a resistance 83 and a capacitor 84 are connected in parallel. The average value of the power detected by the detection section 42 is obtained by the diode 81 and the shunt circuit 82. When the average value of the power exceeds the predetermined power value Pth, the comparator 85 functions to input a logical one to the logical product circuit 44. This allows the logical product circuit 44 to pass the output of the logical sum circuit 44 to the power amplifier 19. Conversely, when a logical zero is input to the logical product circuit 44, the logical product circuit 44 blocks the output of the logical sum circuit 41 for the power amplifier 19.

Figure 9:
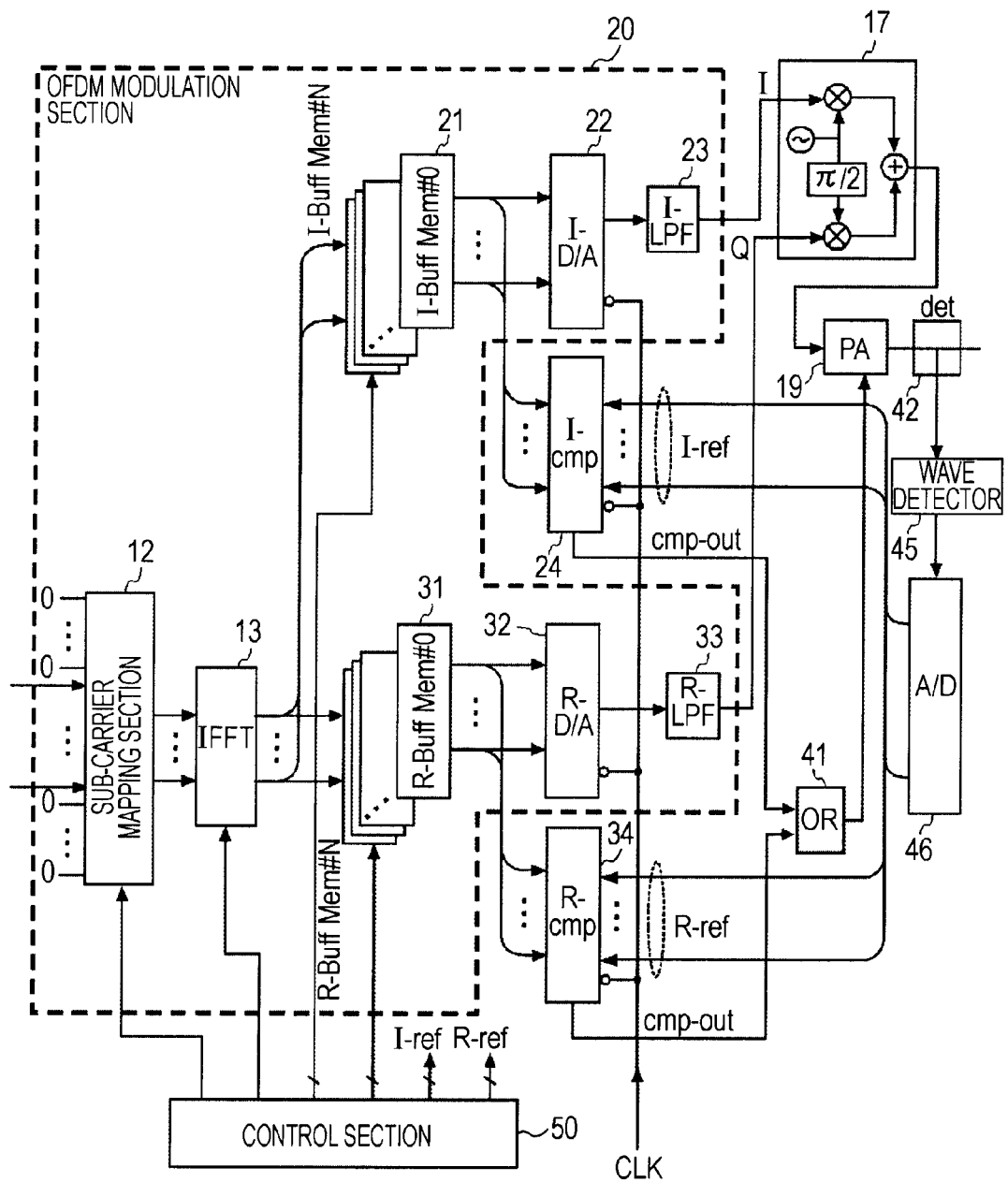
FIG. 9 is a block diagram showing a configuration of a wireless transmission apparatus according to a third embodiment of the present disclosure.

FIG. 9 is a block diagram showing a configuration of a wireless transmission apparatus according to a third embodiment of the present disclosure. In the drawing, elements similar to the elements shown in the first and second embodiments (FIGS. 2 and 7) are denoted by the same reference numerals to omit repeated description. In the drawing, in addition to the second embodiment, a detection section (det) 42 is connected to the output of the power amplifier 19 to take out a part of the output power as detected power, which is converted by a wave detector 45 into an analog voltage. The analog voltage is converted by an analog/digital (A/D) converter 46 into a digital value. A digital signal output from the analog/digital converter 46 is supplied to the digital comparators 24 and 34 as constant digital values that are equivalent to the reference voltages I-ref and R-ref respectively for the imaginary part and the real part. The A/D converter 46 thus functions as a threshold change section that variably sets the predetermined threshold in accordance with the value of the detected power.

This makes it possible to adjust the reference voltages I-ref and R-ref (which are equivalent to the threshold Vth in FIG. 2) in reliance on (the average value of) the detected power. As a result, a high distortion compensation effect is obtained over a wide power range.

Figure 10:
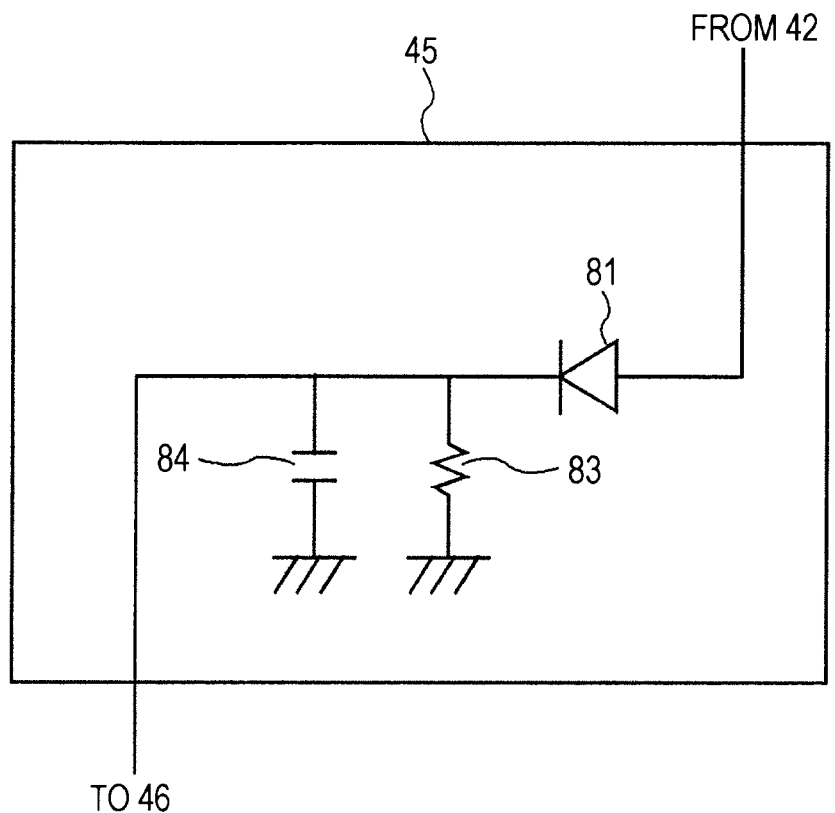
FIG. 10 is a circuit diagram showing an exemplary configuration of a wave detector shown in FIG. 9.

FIG. 10 is a circuit diagram showing an exemplary configuration of the wave detector 45. The wave detector 45 is equivalent to the combination of the diode 81 and the shunt circuit 82 in the comparator 43 shown in FIG. 8. The wave detector 45 has the same function as the circuit portion shown in FIG. 8.

Figure 11:
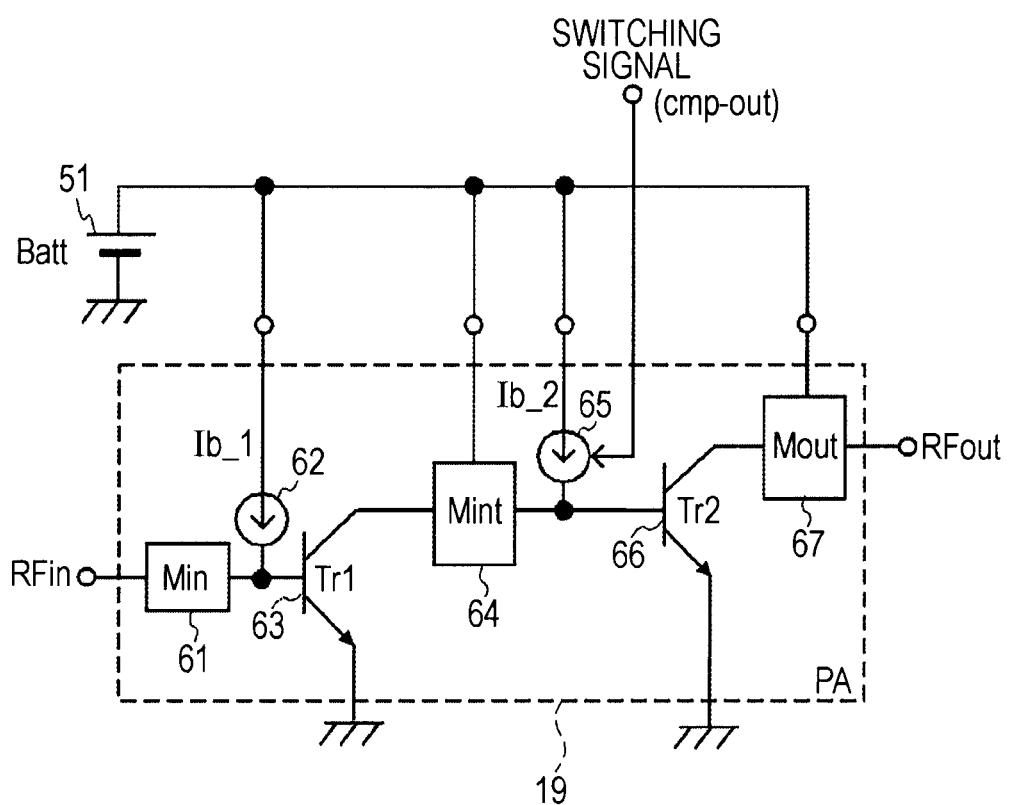
FIG. 11 is a circuit diagram showing an exemplary configuration of a power amplifier used in the embodiment of the present disclosure.

FIG. 11 is a circuit diagram showing an exemplary configuration of the power amplifier 19 used in the embodiment. In the drawing, RFin and RFout respectively indicate an input terminal and an output terminal. The input terminal RFin is connected to the base terminal of a first emitter-grounded transistor (Tr1) 63 via a matching circuit (Min) 61. The matching circuit 61 converts 50 ohms into an impedance that may bring the gain of the transistor Tr1 to a desired value. A predetermined current Ib_1 is supplied to the base terminal of the transistor Tr1 from a power source formed by a battery (Batt) 51 via a first current source 62. The current source 62 supplies a base bias current for the transistor Tr1.

The collector of the first transistor 63 is connected to the base terminal of a second emitter-grounded transistor (Tr2) 66 via a second matching circuit (Mint) 64. The matching circuit 64 converts between both impedances between the gain matching points of both the transistors. A predetermined current Ib_2 is supplied to the base terminal of the transistor Tr2 from the power source via a second current source 65. The second current source 65 supplies a base bias current for the transistor Tr2.

The collector of the transistor Tr2 is connected to the output terminal RFout via a matching circuit (Mout) 67. The matching circuit 67 converts between the maximum output impedance of the transistor Tr2 and 50 ohms.

The current value Ib2 of the second current source 65 is variably controlled using the switching signal (cmp-out) from the comparator 16. That is, the current of the current source Ib2 increases and decreases in accordance with the switching signal. A current increase increases the base current of the transistor Tr2, which changes the saturation output level of the power amplifier 19 to the higher level.

While preferred embodiments of the present disclosure have been described above, the present disclosure is not limited to the specific configurations described above. Various variations and modifications may be made without departing from the scope of the present disclosure. For example, while a known CP (Cyclic Prefix) addition section may not necessarily be provided in an SC-FDMA system, a CP addition section may be provided at a stage subsequent to the IFFT section and prior to the orthogonal modulation section 17 for each of the I- and Q-signals.

It should be understood by those skilled in the art that various modifications, combinations, sub-combinations and alterations may occur depending on design requirements and other factors insofar as they are within the scope of the appended claims or the equivalents thereof.

What is claimed is:
1. A power amplification apparatus comprising:
an inverse fast Fourier transform section configured to perform an inverse fast Fourier transformation on data allocated to a plurality of sub-carriers;
a parallel/serial conversion section configured to output time-domain data received in parallel from the inverse fast Fourier transform section as a time-domain analog signal including a real-part time-domain analog signal and an imaginary-part time-domain analog signal;

a power amplifier configured to perform a power amplification on the time-domain analog signal, wherein a saturation output level of the power amplifier is adjustable in accordance with a switching signal;
a real-part comparator configured to compare an amplitude of a signal in each time slot of the real-part time-domain analog signal with a predetermined threshold, and
an imaginary-part comparator configured to compare an amplitude of a signal in each time slot of the imaginary-part time-domain analog signal with the predetermined threshold, wherein
the saturation output level of the power amplifier is switched based on outputs of the real-part comparator and the imaginary-part comparator.

2. The power amplification apparatus of claim 1, further comprising:
a logical sum circuit configured to calculate a logical sum of the outputs of the real-part comparator and the imaginary-part comparator.

3. The power amplification apparatus of claim 2, wherein the saturation output level of the power amplifier is switched based on an output of the logical sum circuit.

4. The power amplification apparatus of claim 2, further comprising:
a detection section configured to detect an output power of the power amplifier.

5. The power amplification apparatus of claim 4, further comprising:
a wave detection circuit configured to compare the detected output power of the power amplifier with a predetermined value.

6. The power amplification apparatus of claim 5, further comprising:
a logical product circuit configured to calculate a logical product of an output of the logical sum circuit and the wave detection circuit.

7. The power amplification apparatus of claim 6, wherein the saturation output level of the power amplifier is switched based on an output of the logical product circuit.

8. The power amplification apparatus of claim 5, further comprising:
a threshold change section configured to variably set the predetermined threshold based on an output of the wave detection circuit.

9. The power amplification apparatus of claim 8, wherein the output of the wave detection circuit is an analog signal.

10. The power amplification apparatus of claim 9, wherein the threshold change section includes an analog/digital converter configured to convert the output of the wave detection circuit into a digital signal, which is used to set the predetermined threshold.

11. A power amplification method comprising:
performing an inverse fast Fourier transformation on data allocated to a plurality of sub-carriers;
outputting time-domain data received in parallel from the inverse fast Fourier transformation as a time-domain analog signal including a real-part time-domain analog signal and an imaginary-part time-domain analog signal;
performing a power amplification on the time-domain analog signal, wherein a saturation output level of the power amplification is adjustable in accordance with a switching signal;
comparing an amplitude of a signal in each time slot of the real-part time-domain analog signal with a predetermined threshold;
comparing an amplitude of a signal in each time slot of the imaginary-part time-domain analog signal with the predetermined threshold; and
calculating a logical sum of outputs of the real-part comparing and the imaginary-part comparing, wherein
the saturation output level of the power amplification is switched based on the calculated logical sum.

12. The power amplification method of claim 11, further comprising:
detecting an output power of the power amplification.

13. The power amplification method of claim 12, further comprising:
variably setting the predetermined threshold of the real-part comparing and the imaginary-part comparing based on the detected output power of the power amplification.

14. A power amplification method comprising:
performing an inverse fast Fourier transformation on data allocated to a plurality of sub-carriers;
outputting time-domain data received in parallel from the inverse fast Fourier transformation as a time-domain analog signal including a real-part time-domain analog signal and an imaginary-part time-domain analog signal;
performing a power amplification on the time-domain analog signal, wherein a saturation output level of the power amplification is adjustable in accordance with a switching signal;
comparing an amplitude of a signal in each time slot of the real-part time-domain analog signal with a predetermined threshold;
comparing an amplitude of a signal in each time slot of the imaginary-part time-domain analog signal with the predetermined threshold;
calculating a logical sum of outputs of the real-part comparing and the imaginary-part comparing,
detecting an output power of the power amplification;
comparing the detected output power of the power amplification with a predetermined value; and
calculating a logical product of the calculated logical sum and a result of comparing the detected output power of the power amplification with a predetermined value, wherein
the saturation output level of the power amplification is switched based on an output of the calculated logical product.

15. An orthogonal frequency-division multiplexing modulation apparatus comprising:
an inverse fast Fourier transform section configured to perform an inverse fast Fourier transformation on data allocated to a plurality of sub-carriers;
a parallel/serial conversion section configured to output time-domain data received in parallel from the inverse fast Fourier transform section as a time-domain analog signal including a real-part time-domain analog signal and an imaginary-part time-domain analog signal;
a power amplifier configured to perform a power amplification on the time-domain analog signal, wherein a saturation output level of the power amplifier is adjustable in accordance with a switching signal;
a real-part comparator configured to compare an amplitude of a signal in each time slot of the real-part time-domain analog signal with a predetermined threshold;
an imaginary-part comparator configured to compare an amplitude of a signal in each time slot of the imaginary-part time-domain analog signal with the predetermined threshold, wherein the saturation output level of the power amplifier is switched based on outputs of the real-part comparator and the imaginary-part comparator.

16. A wireless transmission apparatus comprising:

an inverse fast Fourier transform section configured to perform an inverse fast Fourier transformation on data allocated to a plurality of sub-carriers;

a parallel/serial conversion section configured to output time-domain data received in parallel from the inverse fast Fourier transform section as a time-domain analog signal including a real-part time-domain analog signal and an imaginary-part time-domain analog signal;

a power amplifier configured to perform a power amplification on the time-domain analog signal, wherein a saturation output level of the power amplifier is adjustable in accordance with a switching signal;

a real-part comparator configured to compare an amplitude of a signal in each time slot of the real-part time-domain analog signal with a predetermined threshold;

an imaginary-part comparator configured to compare an amplitude of a signal in each time slot of the imaginary-part time-domain analog signal with the predetermined threshold, wherein the saturation output level of the power amplifier is switched based on outputs of the real-part comparator and the imaginary-part comparator.

* * * * *